United States Patent
Koike

(10) Patent No.: US 11,749,590 B2
(45) Date of Patent: Sep. 5, 2023

(54) WIRING SUBSTRATE DEVICE

(71) Applicant: SHINKO ELECTRIC INDUSTRIES CO., LTD., Nagano (JP)

(72) Inventor: Tatsuya Koike, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 292 days.

(21) Appl. No.: 17/123,668

(22) Filed: Dec. 16, 2020

(65) Prior Publication Data

US 2021/0104454 A1 Apr. 8, 2021

Related U.S. Application Data

(62) Division of application No. 16/137,017, filed on Sep. 20, 2018, now abandoned.

(30) Foreign Application Priority Data

Sep. 25, 2017 (JP) .................. 2017-183549

(51) Int. Cl.
| | |
|---|---|
| H01L 23/528 | (2006.01) |
| H01L 23/498 | (2006.01) |
| H05K 3/34 | (2006.01) |
| H05K 1/11 | (2006.01) |
| H05K 3/46 | (2006.01) |
| H05K 3/40 | (2006.01) |

(52) U.S. Cl.
CPC .. *H01L 23/49822* (2013.01); *H01L 23/49827* (2013.01); *H01L 23/49894* (2013.01); *H05K 1/115* (2013.01); *H05K 3/34* (2013.01); *H05K 3/3452* (2013.01); *H05K 3/4015* (2013.01); *H05K 3/4644* (2013.01); *H01L 2224/16225* (2013.01); *H01L 2224/32225* (2013.01); *H01L 2224/73204* (2013.01); *H05K 2201/095* (2013.01); *H05K 2201/098* (2013.01); *H05K 2203/02* (2013.01)

(58) Field of Classification Search
CPC ....................................................... H01L 23/528
See application file for complete search history.

(56) References Cited

U.S. PATENT DOCUMENTS

| 5,422,516 A | 6/1995 | Hosokawa et al. |
| 6,358,630 B1 | 3/2002 | Tsukada et al. |
| (Continued) | | |

FOREIGN PATENT DOCUMENTS

| JP | H05-152381 A | 6/1993 |
| JP | 11-103160 | 4/1999 |
| (Continued) | | |

OTHER PUBLICATIONS

Japanese Office Action with English Translation dated Apr. 6, 2021, 8 pages.

*Primary Examiner* — Moazzam Hossain
*Assistant Examiner* — Hajar Kolahdouzan
(74) *Attorney, Agent, or Firm* — Rankin, Hill & Clark LLP

(57) ABSTRACT

A wiring substrate device includes a wiring substrate, a plurality of terminals each of which is provided upright on the wiring substrate and has a lower end, an upper end and a narrowed part between the lower end and the upper end, and a plurality of solders each of which has a melting point lower than the terminals and covers a surface of the corresponding terminal.

5 Claims, 24 Drawing Sheets

(56) References Cited

U.S. PATENT DOCUMENTS

| | | | |
|---|---|---|---|
| 2011/0063812 A1 | 3/2011 | Nakanishi et al. | |
| 2011/0303443 A1* | 12/2011 | Kitajima | H01L 24/10 |
| | | | 29/829 |
| 2017/0178984 A1* | 6/2017 | Ko | H01L 22/14 |

FOREIGN PATENT DOCUMENTS

| | | | |
|---|---|---|---|
| JP | 2010-225598 A | 10/2010 | |
| JP | 2010-267743 | 11/2010 | |
| JP | 2010-278139 A | 12/2010 | |
| JP | 2011-082482 A | 4/2011 | |
| JP | 2014-192177 A | 10/2014 | |

* cited by examiner

WIRING SUBSTRATE DEVICE

CROSS-REFERENCE TO RELATED APPLICATION

The present application claims priority from Japanese Patent Application No. 2017-183549 filed on Sep. 25, 2017, the entire content of which is incorporated herein by reference.

BACKGROUND

Technical Field

The present disclosure relates to a wiring substrate device.

Related Art

There are various types of terminals for connecting components such as a semiconductor device to a wiring substrate. Among them, solder bumps have been widely used because they are melted by reflow and the semiconductor device can be thus easily mounted on the wiring substrate.

However, when the solder bumps are melted by the reflow, the adjacent solder bumps are contacted to each other, so that the solder bumps may be electrically shorted. Furthermore, the melted solder bumps are squashed, so that an interval between the wiring substrate and the semiconductor device is reduced and the semiconductor device may be thus contacted to the wiring substrate, in some cases.

Patent Document 1: JP-A-H11-103160

SUMMARY

Exemplary embodiments of the present invention provides a wiring substrate device capable of keeping an interval between a wiring substrate and a component and suppressing electrical short of terminals adjacent to each other.

A wiring substrate device according to an exemplary embodiment comprises:

a wiring substrate;

a plurality of terminals each of which is provided upright on the wiring substrate and has a lower end, an upper end and a narrowed part between the lower end and the upper end; and a plurality of solders each of which has a melting point lower than the terminals and covers a surface of the corresponding terminal.

According to one aspect, since the melted solder is accumulated at the narrowed part of the terminal, it is possible to prevent the melted solder from spreading in a horizontal direction of the substrate and to suppress electrical short of the adjacent terminals via the solder.

DETAILED DESCRIPTION

Before describing exemplary embodiments, the matters that have been examined by the inventor are described.

Figure 1:
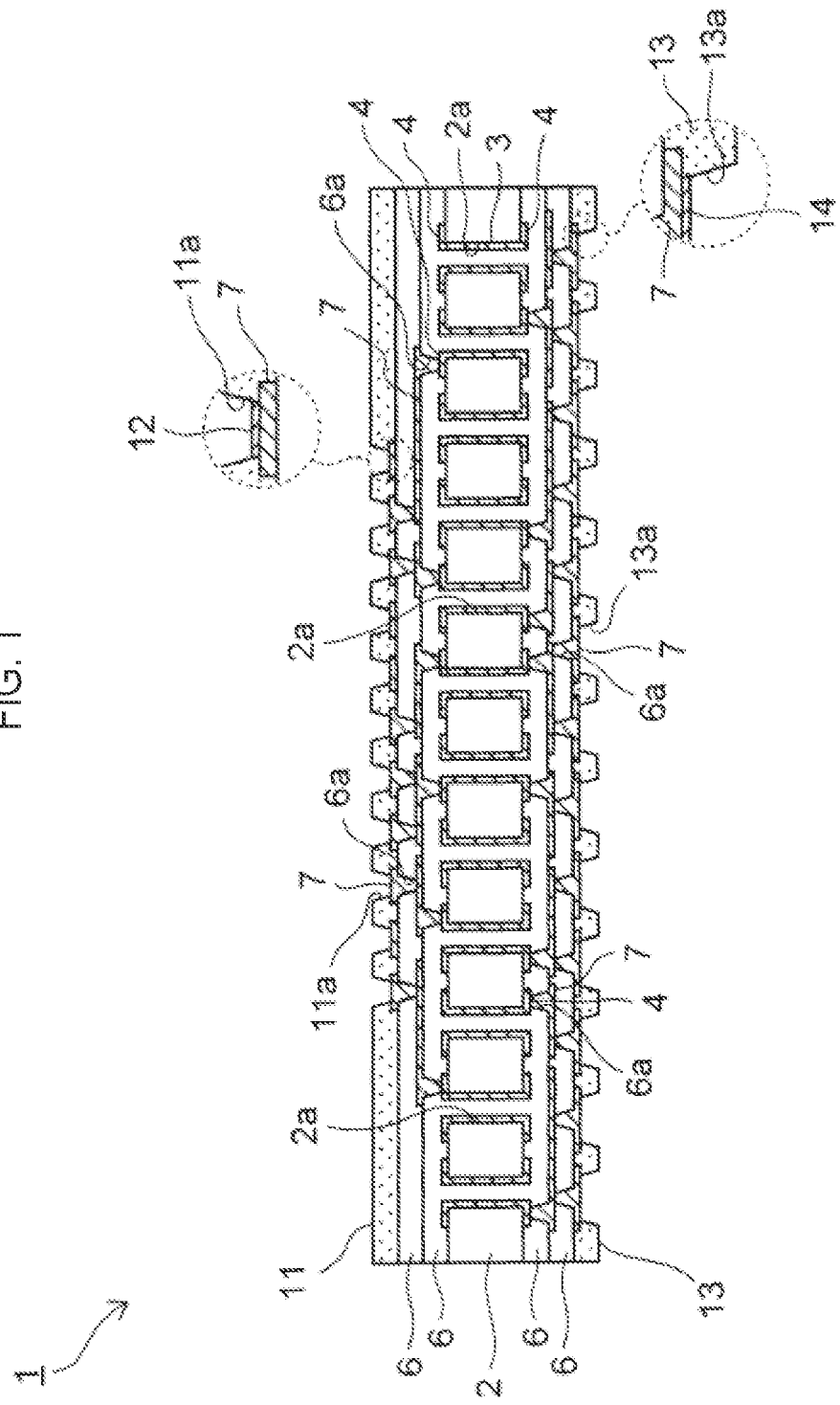
FIG. 1 is an entire sectional view of a wiring substrate used for examination.

FIG. 1 is an entire sectional view of a wiring substrate used for examination.

The wiring substrate 1 is a multi-layered wiring substrate, and is configured by stacking alternately insulation layers 6 and wirings 4, 7 on both surfaces of a core base material 2.

The core base material 2 is a glass epoxy substrate in which epoxy resin is impregnated in glass cloth, and has a plurality of through-holes 2a. The through-hole 2a and opening ends thereof are formed with copper plated films, so that a through-electrode 3 is provided in the through-hole 2a and the wiring 4 is provided on the core base material 2 around the through-electrode 3.

Also, the insulation layer 6 is a resin layer such as a phenol resin, a polyimide resin and the like. The resin layer 6 is formed with a via hole 6a reaching the wiring 4 by laser processing or the like, and the wiring 7 is formed in the via hole 6a and on the insulation layer 6 around the via hole by copper plating.

An upper main surface of both main surfaces of the wiring substrate 1 is formed with a first solder resist layer 11. The first solder resist layer 11 is provided with first openings 11a exposing the wiring 7 of the uppermost layer. A surface of the wiring 7 in the first opening 11a is formed with a first diffusion prevention layer 12.

The first diffusion prevention layer 12 is a metal layer for preventing a solder, which is to be formed later on the first diffusion prevention layer, from diffusing into the wiring 7, and is also referred to as a UBM (Under Barrier Metal). In this example, a nickel layer, a palladium layer and a gold layer are formed in corresponding order, as the first diffusion prevention layer 12.

In the meantime, a lower main surface of both the main surfaces of the wiring substrate 1 is formed with a second solder resist layer 13. The second solder resist layer 13 is formed with second openings 13a exposing the wiring 7 of the lowest layer. A surface of the wiring 7 in the second opening 13a is formed with a second diffusion prevention layer 14.

Like the first diffusion prevention layer 12, the second diffusion prevention layer 14 is a stacked film formed by stacking a nickel layer, a palladium layer and a gold layer in corresponding order.

In this example, a semiconductor device is mounted on the wiring substrate 1, as follows.

FIGS. 2A to 3B are enlarged sectional views depicting states where a wiring substrate device using the wiring substrate 1 is being manufactured.

Figure 2A:
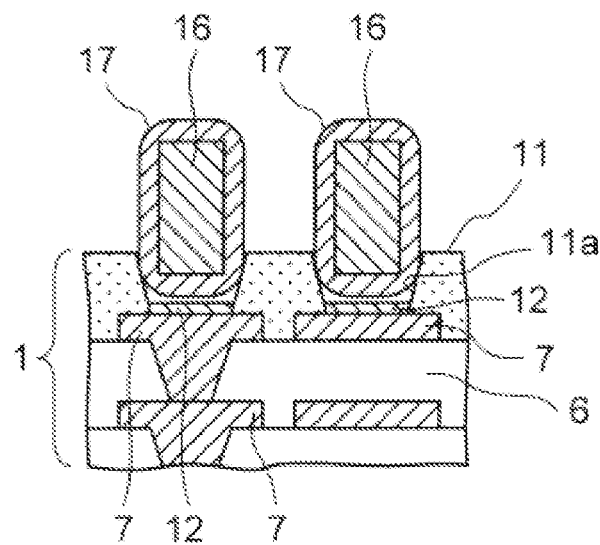
FIGS. 2A and 2B are enlarged sectional views depicting a state where a wiring substrate device used for examination is being manufactured (1 thereof).

First, as shown in FIG. 2A, a terminal 16 is erected in the first opening 11a.

The terminal 16 has a column shape obtained by cutting a nickel wire rod into a predetermined length, and a solder 17 is formed on a surface thereof by barrel plating.

Figure 2B:
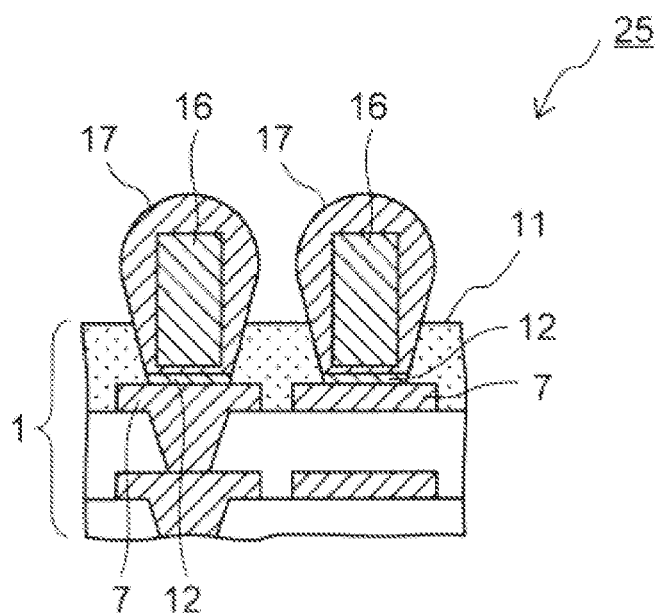

Subsequently, as shown in FIG. 2B, the solder 17 is reflowed and melted, so that the terminal 16 is joined to the wiring 7 via the solder 17 and the first diffusion prevention layer 12. Upon the reflow, the solder 17 is formed to have a schematically spherical shape by surface tension.

By the above processes, a basic structure of a wiring substrate device 25 relating to this example is completed.

Then, the wiring substrate device 25 is subjected to a process of mounting thereon a semiconductor device.

Figure 3A:
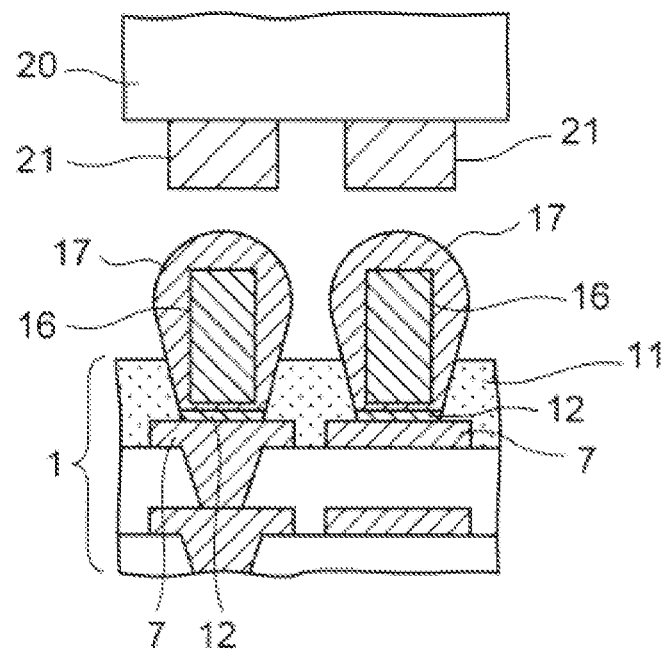
FIGS. 3A and 3B are enlarged sectional views depicting a state where the wiring substrate device used for examination is being manufactured (2 thereof).

First, as shown in FIG. 3A, a semiconductor device 20 having a plurality of electrodes 21 is prepared, and the electrodes 21 and the terminals 16 are positionally aligned. Although the electrode 21 is not particularly limited, a copper post is formed as the electrode 21, in this example.

Figure 3B:
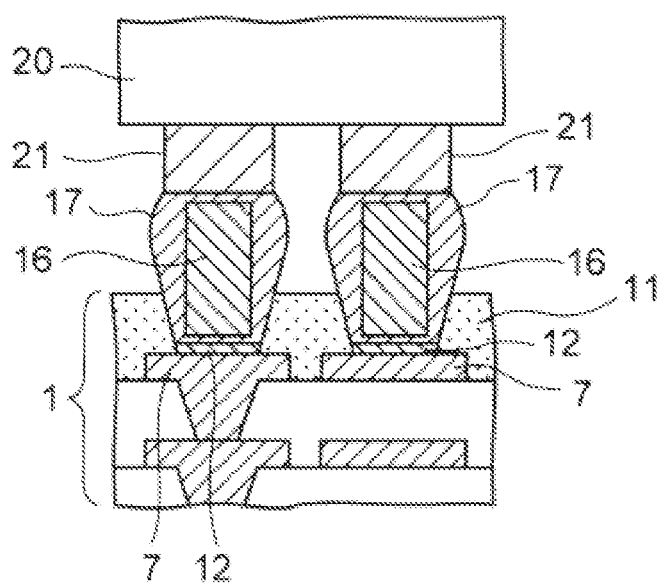

Then, as shown in FIG. 3B, while pressing the semiconductor device 20 toward the wiring substrate 1, the solders 17 are reflowed and melted, so that the terminals 16 and the electrodes 21 are interconnected via the solders 17.

During the reflow, a heating temperature is set to a temperature higher than a melting point of the solder 17 and lower than a melting point of the terminal 16. For this reason, the solder 17 is melted by the reflow but the terminal 16 keeps the column shape without being melted.

By the above processes, the basic processes of this example are over.

According to the wiring substrate device 25, since the nickel terminal 16 having the melting point higher than the solder 17 is adopted, the terminal 16 is not melted even when the solder 17 is reflowed in the process of FIG. 3B. Thereby, even when the semiconductor device 20 is pressed upon the reflow, the terminal 16 is not squashed. Accordingly, an interval between the first wiring substrate 1 and the semiconductor device 20 is kept by the terminals 16 and it is possible to prevent the semiconductor device 20 from contacting the first wiring substrate 1.

However, following problems may occur in the wiring substrate device 25.

Figure 4:
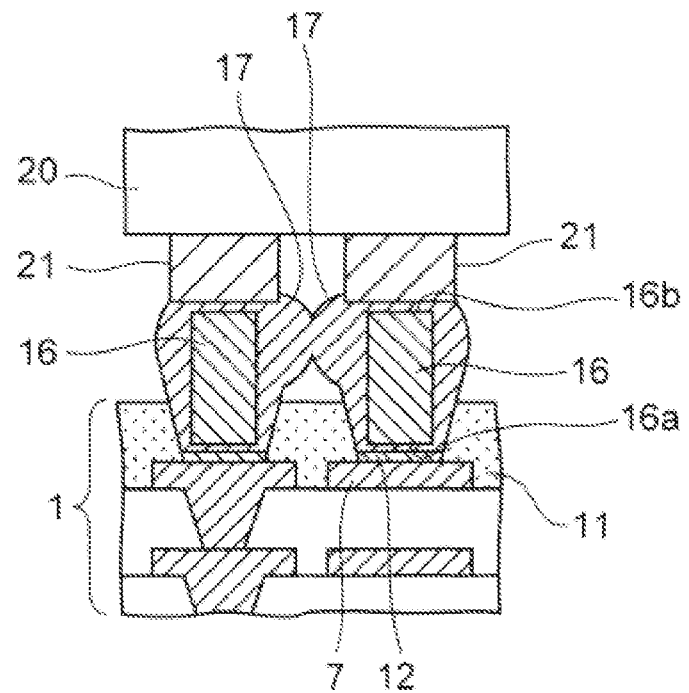
FIG. 4 is an enlarged sectional view for illustrating a problem of the wiring substrate device used for examination (1 thereof).
Figure 5:
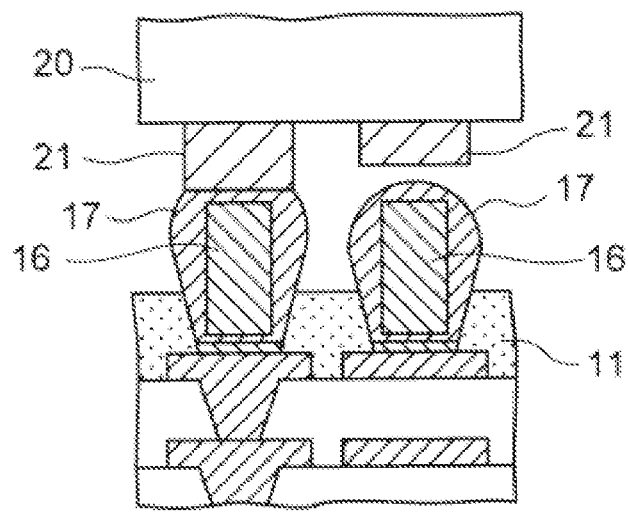
FIG. 5 is an enlarged sectional view for illustrating a problem of the wiring substrate device used for examination (2 thereof).
Figure 6:
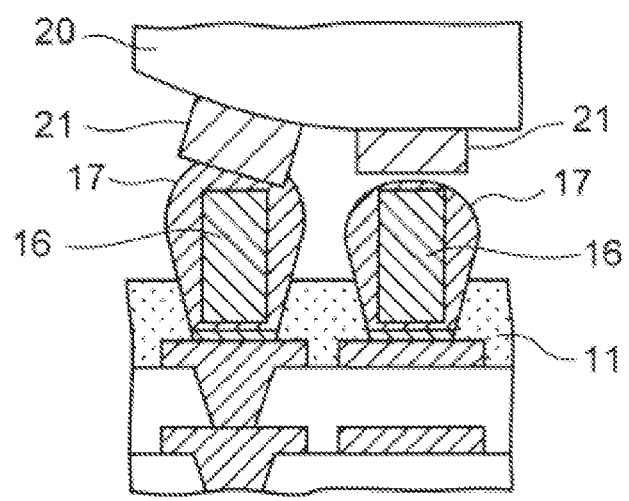
FIG. 6 is an enlarged sectional view for illustrating a problem of the wiring substrate device used for examination (3 thereof).

FIGS. 4 to 6 are enlarged sectional views for illustrating the problems.

In an example of FIG. 4, when the solders 17 are reflowed in the process of FIG. 2B or 3B, the solders 17 are spread in a horizontal direction due to the surface tension, so that the adjacent terminals 16 are electrically shorted via the solders 17.

In order to avoid the above problem, it is considered to reduce an amount of the solder 17 on the surface of the terminal 16. However, according to this method, an amount of the solder 16 is insufficient at a lower end 16a and an upper end 16b of the terminal 16, so that joining strength between the lower end 16a and the wiring 7 and joining strength between the upper end 16a and the electrode 21 may be insufficient.

FIG. 5 is an enlarged sectional view depicting a case where heights of the plurality of electrodes 21 are not uniform due to a manufacturing error.

In this case, the solder 17 is not contacted to the electrode 21 of which height is low, so that the electrode 21 and the terminal 16 corresponding to the electrode are not electrically connected to each other.

FIG. 6 is an enlarged sectional view depicting a case where the semiconductor device 20 is bent due to thermal expansion and the like.

In this case, a part of the electrodes 21 is detached from the terminal 16 due to the bending of the semiconductor device 20, so that the terminal 16 and the electrode 21 cannot be connected to each other by the solder 17.

In the below, each exemplary embodiment capable of avoiding the above problems is described.

First Exemplary Embodiment

First, a terminal that is used in a first exemplary embodiment is described.

Figure 7A:
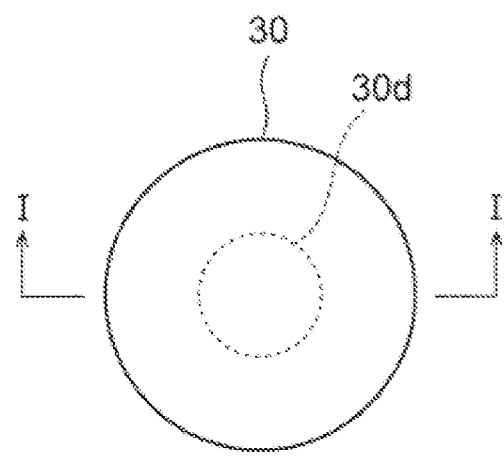
FIG. 7A is a top view of a terminal relating to a first exemplary embodiment.
Figure 7B:
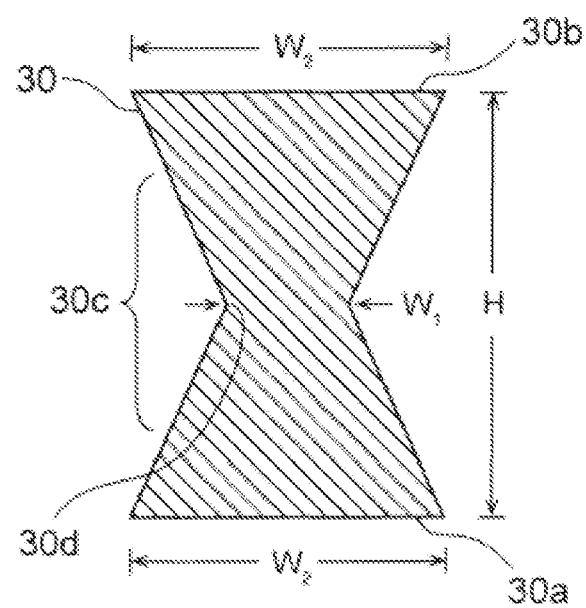
FIG. 7B is a sectional view taken along a line I-I of FIG. 7A.

FIG. 7A is a top view of the terminal, and FIG. 7B is a sectional view taken along a line I-I of FIG. 7A.

As shown in FIG. 7A, a terminal 30 has a circular shape, as seen from above.

Also, as shown in FIG. 7B, the terminal 30 has a lower end 30a and an upper end 30b, and a narrowed part 30c having a width narrower than each of the lower end 30a and the upper end 30b is provided between the lower and upper ends.

In this example, the narrowed part 30c is provided with a narrow portion 30d having a smallest width $W_1$, as seen from a cross sectional view. A sectional shape of the terminal 30 is narrowed in a tapered shape from the lower end 30a toward the narrow portion 30d, and a sectional shape of the terminal 30 is widened in a tapered shape from the narrow portion 30d toward the upper end 30b.

A size of the terminal 30 is not particularly limited. For example, a height H of the terminal 30 is about 10 μm to 1000 μm, and a width $W_2$ of each of the lower end 30a and the upper end 30b is about 10 μm to 500 μm. Also, the width $W_1$ of the narrow portion 30d is about 5 μm to 495 μm, and more preferably about 300 μm.

Also, a material of the terminal 30 is not particularly limited. For example, the terminal 30 may be formed of any one of nickel, copper, gold and aluminum.

In the first exemplary embodiment, a solder is provided on a surface of the terminal 30, as follows.

Figure 8:
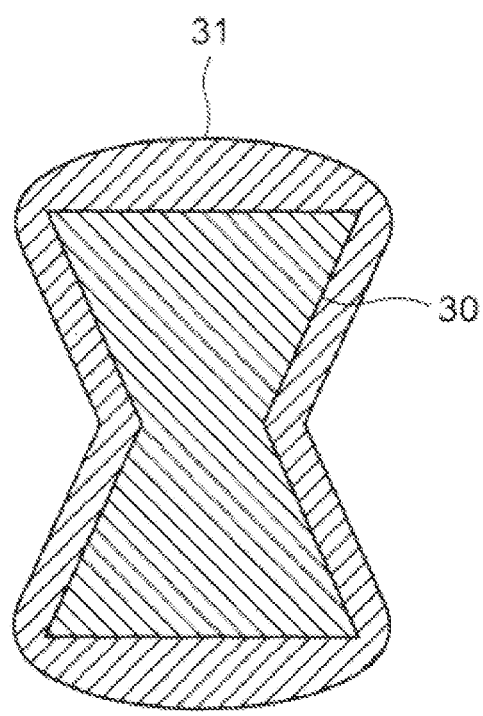
FIG. 8 is a sectional view of the terminal having a solder provided on a surface thereof in accordance with the first exemplary embodiment.

FIG. 8 is a sectional view of the terminal 30 having a solder 31 provided on the surface thereof.

The solder 31 is formed to have a thickness of about 5 μm to 100 μm on the entire surface of the terminal 30 by barrel plating, for example.

Also, a material of the solder 31 is not particularly limited inasmuch as it is a material having a melting point lower than the terminal 30. For example, tin or lead may be adopted.

Subsequently, a manufacturing method of the terminal 30 is described.

Figure 9A:
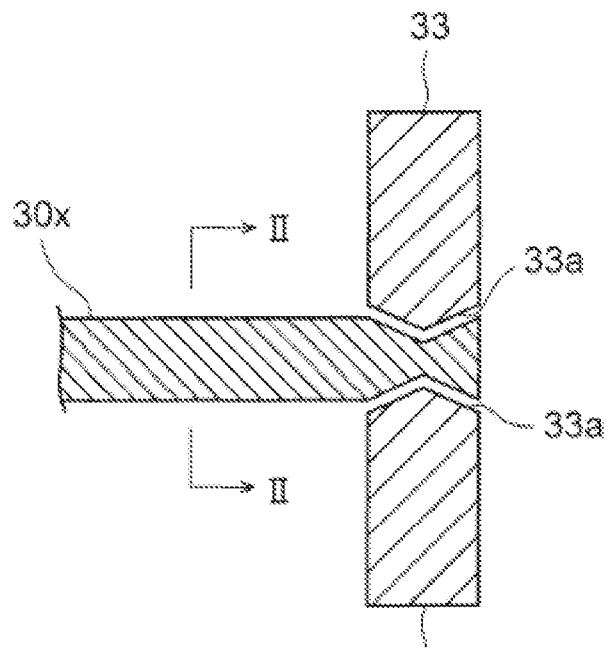
FIG. 9A is a sectional view depicting a manufacturing method of the terminal relating to the first exemplary embodiment.

FIG. 9A is a sectional view depicting a manufacturing method of the terminal 30. Also, FIG. 9B is a partial sectional side view taken along a line II-II of FIG. 9A.

Figure 9B:
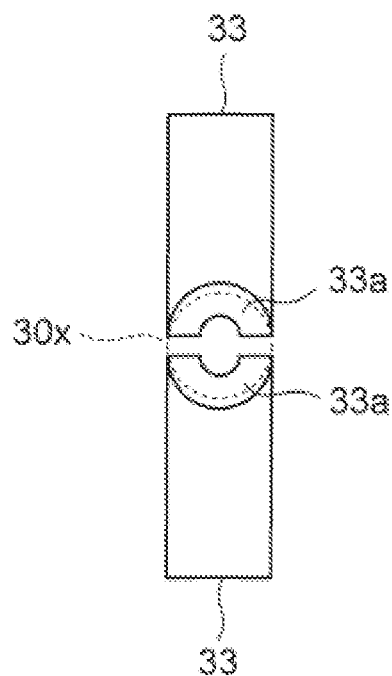
FIG. 9B is a partial sectional side view taken along a line II-II of FIG. 9A.

As shown in FIGS. 9A and 9B, in this example, jigs 33 are arranged above and below a linear nickel wire rod 30x. The jig 33 is formed with an inclined surface 33a corresponding to the narrowed part 30c (refer to FIG. 7B). The wire rod 30x is rotated and pinched several times by the jigs 33, so that the wire rod 30x is processed into a tapered shape.

In the meantime, the wire rod 30x may be processed into a tapered shape by a rolling processing method or the like.

After processed into the tapered shape, the wire rod 30x is cut into a predetermined length, so that the terminal 30 having the narrowed part 30c is obtained.

Subsequently, a wiring substrate device having the terminals 30 is described with reference to a manufacturing method thereof.

FIGS. 10A to 11B are enlarged sectional views depicting states where a wiring substrate device of the first exemplary embodiment is being manufactured. In FIGS. 10A to 11B, the same elements as those described in FIGS. 1 to 3B are denoted with the same reference numerals as those in FIGS. 1 to 3B and the descriptions thereof are omitted.

In the first exemplary embodiment, the terminal 30 is provided upright on the wiring substrate 1, as follows.

Figure 10A:
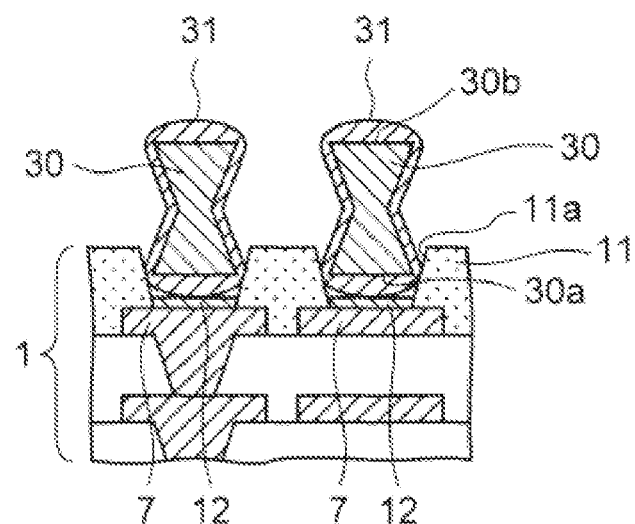
FIGS. 10A and 10B are enlarged sectional views depicting a state where a wiring substrate device in accordance with the first exemplary embodiment is being manufactured (1 thereof).

First, as shown in FIG. 10A, the terminals 30 are erected in the first openings 11a of the first solder resist layer 11 with the lower ends 30a being located downward.

Figure 10B:
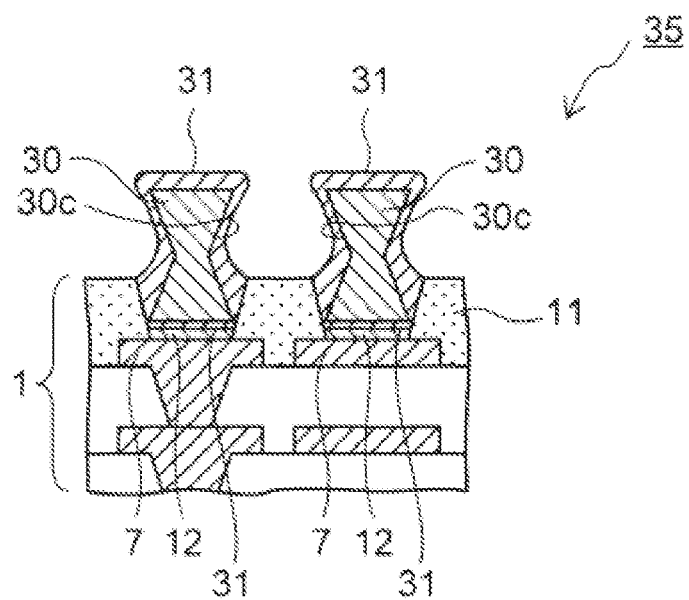

Then, as shown in FIG. 10B, the solders 31 are reflowed and melted, so that the terminals 30 are connected to the wiring 7 via the solders 31 and the first diffusion prevention layers 12. During the reflow, a heating temperature is set to a temperature higher than the melting point of the solder 31 and lower than the melting point of the terminal 30, for example, about 100° C. to 400° C.

In the first exemplary embodiment, during the reflow, since the melted solder 31 is accumulated at the narrowed part 30c by the surface tension, it is possible to prevent the solder 31 from spreading in a horizontal direction and to reduce a risk that the adjacent terminals 30 will be electrically shorted by the solder 31.

In the meantime, as described above, since the heating temperature of the reflow is lower than the melting point of the terminal 30, the terminal 30 is not melted by the reflow.

By the above processes, a wiring substrate device 35 of the first exemplary embodiment is completed. In this embodiment, as shown in FIG. 8, the solder 31 is provided on the entire surface of the terminal 30. However, the solder 31 may not be provided on the lower end 30a of the terminal 30 and the lower end 30a of the terminal 30 may be in direct contact with the wiring 7 without the solder 31 and the first diffusion prevention layer 12.

In the wiring substrate device 35, the first solder resist layer 11 is formed on the wiring 7 around the terminal 30, and the terminal 30 protrudes from the first solder resist layer 11.

Subsequently, a process of mounting a component such as a semiconductor device on the terminal 30 of the wiring substrate device 35 is performed.

Figure 11A:
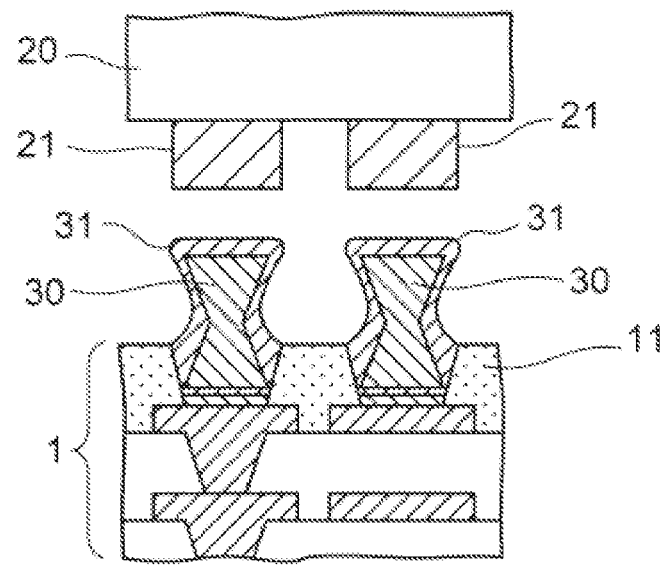
FIGS. 11A and 11B are enlarged sectional views depicting a state where the wiring substrate device in accordance with the first exemplary embodiment is being manufactured (2 thereof).

First, as shown in FIG. 11A, a semiconductor device 20 having a plurality of electrodes 21 is prepared, and the electrodes 21 and the terminals 30 are positionally aligned. A type of the semiconductor device 20 is not particularly limited. For example, a processor such as a CPU (Central Processing Unit) may be adopted as the semiconductor device 20.

Also, like the example of FIG. 3A, the electrode 21 is a metal post such as a copper post.

Figure 11B:
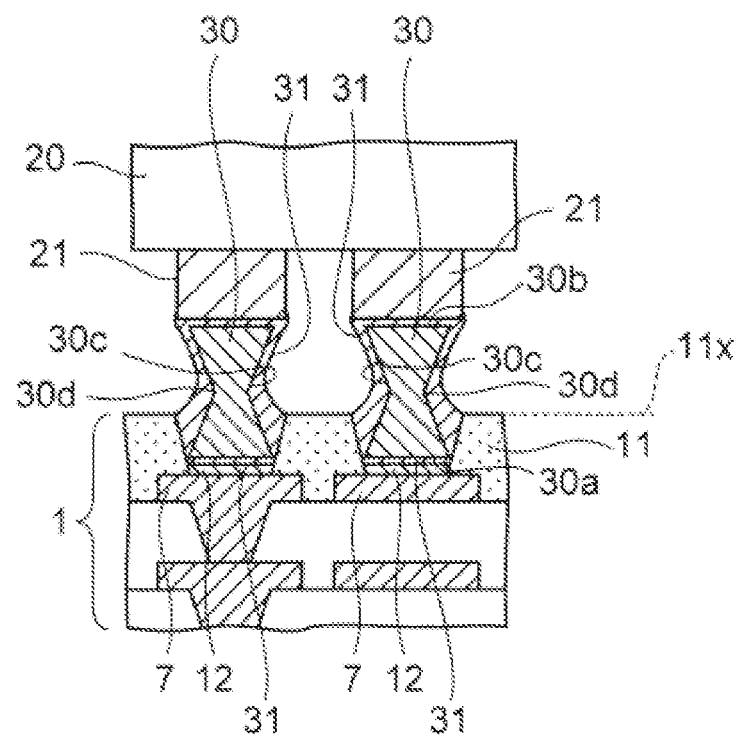

Then, as shown in FIG. 11B, the solders 31 are reflowed and melted while pressing the semiconductor device 20 toward the wiring substrate 1, so that the terminals 30 and the electrodes 21 are interconnected via the solders 31.

During the reflow, the heating temperature is set to a temperature higher than the melting point of the solder 31 and lower than the melting point of the terminal 30, for example, about 100° C. to 400° C. For this reason, during the reflow, the terminals 30 are not melted and an interval between the wiring substrate 1 and the semiconductor device 20 can be kept by the terminals 30 even when the semiconductor device 20 is pressed toward the wiring substrate 1, so that the semiconductor device 20 can be prevented from contacting the wiring substrate 1.

Furthermore, the melted solder 31 is accumulated at the narrowed part 30c of the terminal 30, so that the solder 31 does not spread in the horizontal direction and it is thus possible to reduce a possibility that the adjacent terminals 30 will be electrically shorted due to the solder 31.

In particular, like this example, the narrow portion 30d is positioned above an upper surface 11x of the first solder resist layer 11, so that it is possible to prevent the narrow portion 30d from being screened by the first solder resist layer 11. As a result, the more solder 31 can be accumulated at the narrowed part 30c, so that it is possible to effectively suppress the solder 31 from spreading in the horizontal direction.

Also, the narrow portion 30d is exposed, so that the solder 31 can be accumulated between the narrow portions 30d, which are most distant from each other between the adjacent terminals 30. Accordingly, it is possible to suppress the solder 31 from spreading in the horizontal direction.

In this way, the basic processes of the first exemplary embodiment are completed.

Figure 12:
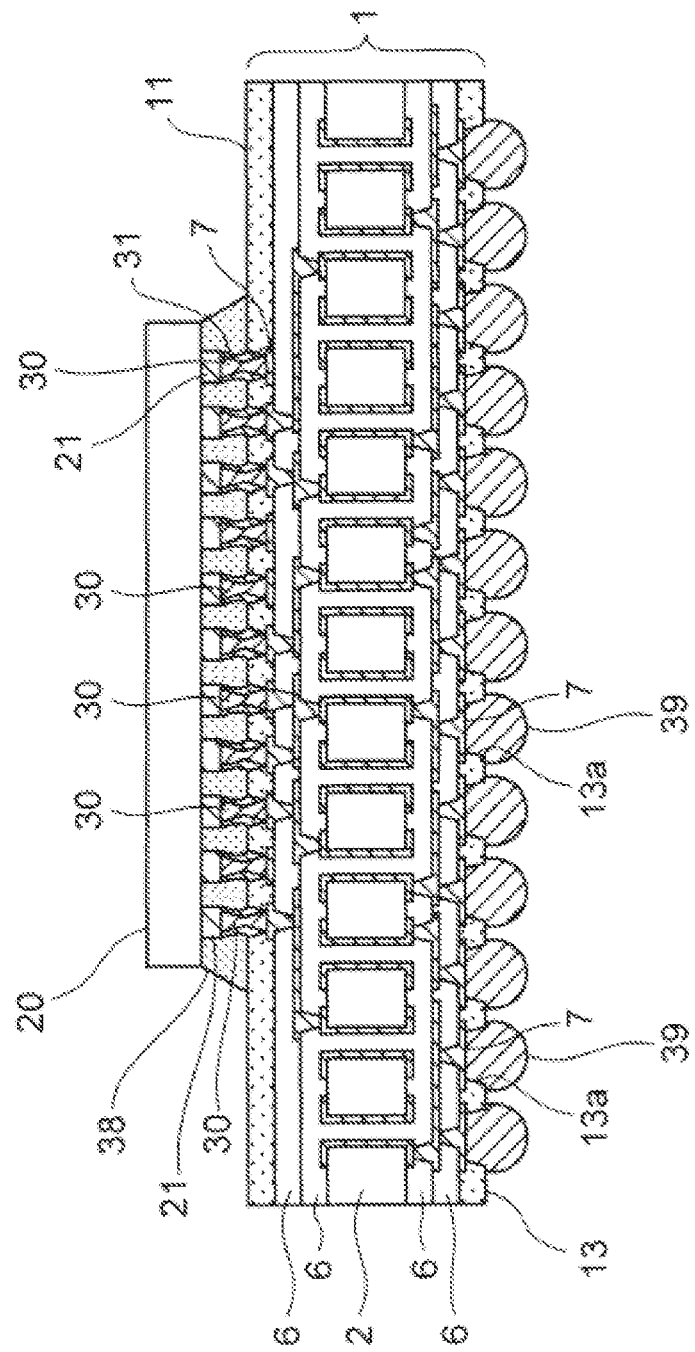
FIG. 12 is an entire sectional view of the wiring substrate device in accordance with the first exemplary embodiment.

FIG. 12 is an entire sectional view including the semiconductor device 20.

In this example, after the semiconductor device 20 is mounted on the wiring substrate 1, as described above, an underfill resin 38 is filled between the wiring substrate 1 and the semiconductor device 20. Also, a solder bump functioning as an external connection terminal 39 is formed on the wiring 7 exposed from the second opening 13a of the second solder resist layer 13.

In the meantime, the underfill resin 38 and the external connection terminal 39 may be omitted if they are not necessary. This applies to each exemplary embodiment to be described later, as well.

According to the first exemplary embodiment, the terminals 30 having the melting point higher than the solder 31 are arranged between the wiring substrate 1 and the semiconductor device 20. Thereby, even when the solder 31 is reflowed, it is possible to keep the interval between the wiring substrate 1 and the semiconductor device 20 and to reduce a contact possibility of the wiring substrate 1 and the semiconductor device 20.

In particular, when using the underfill resin 38, as shown in FIG. 12, the interval between the wiring substrate 1 and the semiconductor device 20 is kept, so that the underfill resin 38 can be easily filled therebetween.

Also, as shown in FIG. 11B, the terminal 30 is provided with the narrowed part 30c, so that it is possible to prevent the solder 31 from spreading in the horizontal direction of the substrate and to reduce a possibility that the adjacent terminals 30 will be interconnected via the solder 31.

Furthermore, since it is not necessary to reduce an amount of the solder 31 so as to prevent the solder 31 from spreading in the horizontal direction, a sufficient amount of the solder 31 is uniformly spread to each of the lower end 30a and the upper end 30b of the terminal 30. As a result, it is possible to sufficiently secure connection strength between the terminal 30 and the wiring substrate 1 and connection strength between the terminal 30 and the semiconductor device 20 by the solder 31, so that it is possible to maintain connection reliability between the wiring substrate 1 and the semiconductor device 20.

Also, according to the first exemplary embodiment, following effects can also be accomplished.

Figure 13:
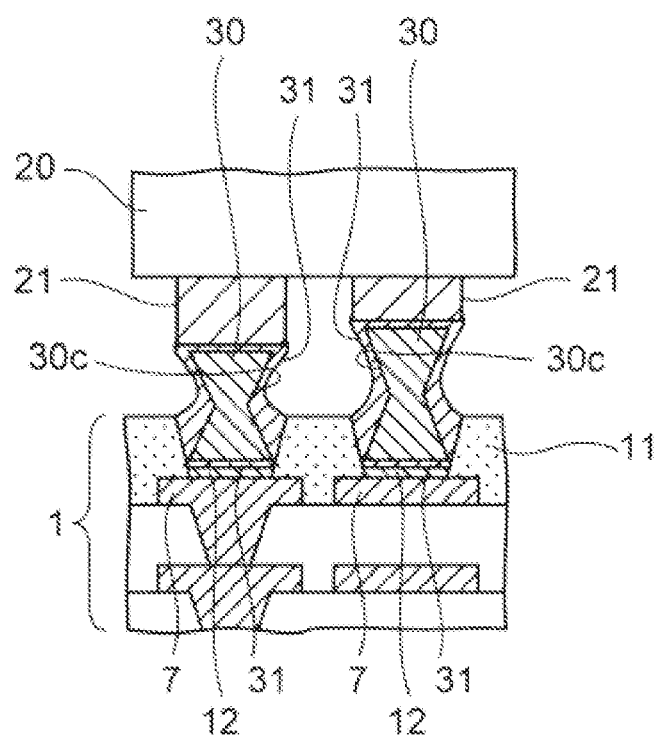
FIG. 13 is an enlarged sectional view for illustrating an effect to be accomplished in the first exemplary embodiment (1 thereof).
Figure 14:
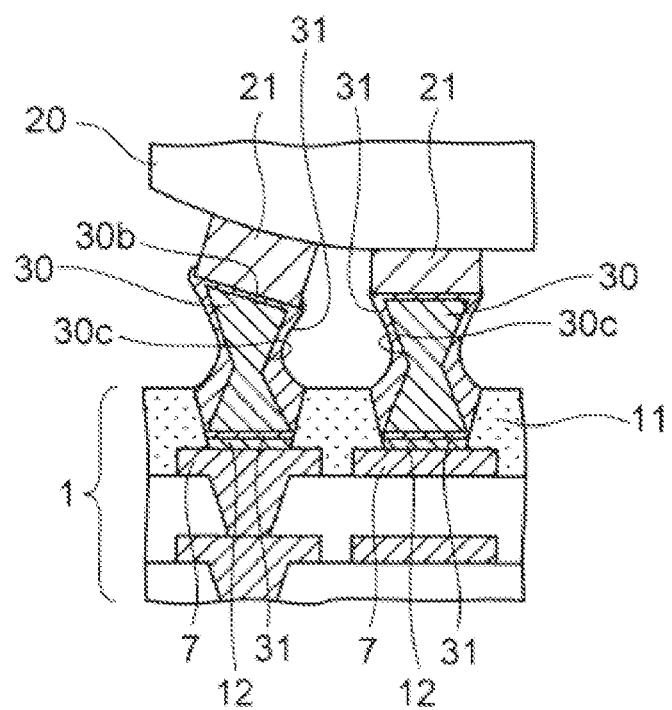
FIG. 14 is an enlarged sectional view for illustrating an effect to be accomplished in the first exemplary embodiment (2 thereof).

FIGS. 13 and 14 are enlarged sectional views for illustrating effects to be accomplished in the first exemplary embodiment.

FIG. 13 is a sectional view depicting a case where the heights of the plurality of electrodes 21 are not uniform due to a manufacturing error.

In this case, when the semiconductor device 20 is pressed in the process of FIG. 11B, the narrowed parts 30c, which are mechanically weak, are squashed, so that it is possible to absorb the non-uniformity of the heights of the respective electrodes 21 by the terminals 30. For this reason, unlike the example of FIG. 5, it is possible to suppress a situation where a part of the plurality of terminals 30 is not connected to the electrode 21, so that it is possible to suppress a yield of the wiring substrate device from being lowered.

FIG. 14 is a sectional view depicting a case where the semiconductor device 20 is bent due to thermal expansion or the like.

In this case, when the semiconductor device 20 is pressed in the process of FIG. 11B, the terminal 30 is bent at the narrowed part 30c, so that the upper end 30b of the terminal 30 conforms to the bending of the semiconductor device 20. Thereby, unlike the example of FIG. 6, it is possible to connect each of the plurality of terminals 30 to the electrode 21.

Second Exemplary Embodiment

In a second exemplary embodiment, an amount of the solder 31 to be accumulated at the narrowed part 30c is larger than the first exemplary embodiment.

Figure 15A:
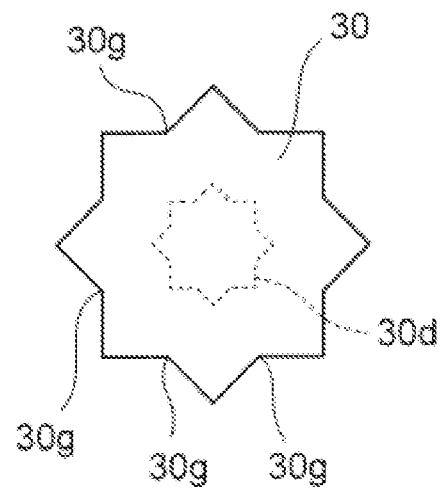
FIG. 15A is a top view of a terminal relating to a second exemplary embodiment.
Figure 15B:
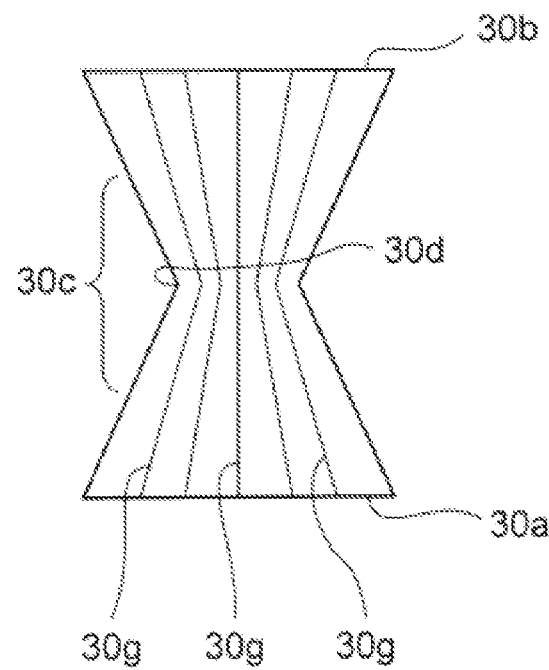
FIG. 15B is a side view of the terminal.

FIG. 15A is a top view of the terminal 30 of the second exemplary embodiment, and FIG. 15B is a side view of the terminal 30.

Meanwhile, in FIGS. 15A and 15B, the same elements as those described in the first exemplary embodiment are denoted with the same reference numerals as those in the first exemplary embodiment and the descriptions thereof are omitted.

As shown in FIGS. 15A and 15B, in the second exemplary embodiment, a side of the terminal 30 is formed with a plurality of grooves 30g extending from the lower end 30a to the upper end 30b.

Figure 16A:
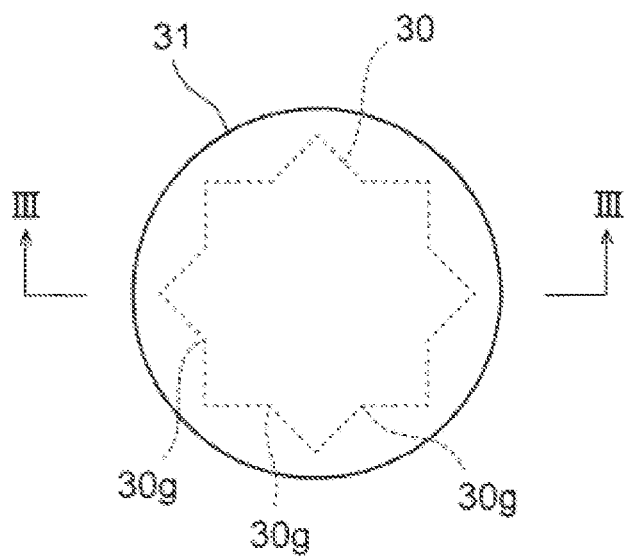
FIG. 16A is a top view depicting a case where the terminal relating to the second exemplary embodiment is provided with a solder.
Figure 16B:
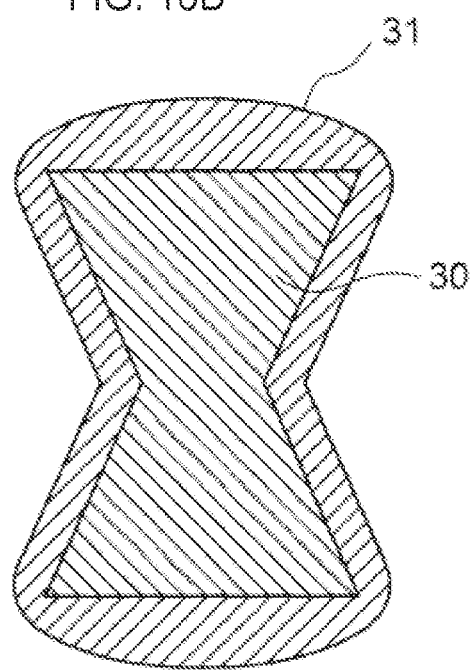
FIG. 16B is a sectional view taken along a line III-III of FIG. 16A.

FIG. 16A is a top view depicting a case where the terminal 30 is provided with the solder 31, and FIG. 16B is a sectional view taken along a line III-III of FIG. 16A.

Like the first exemplary embodiment, the solder 31 is formed on the surface of the terminal 30 by the barrel plating.

In particular, as shown in FIG. 16A, in the second exemplary embodiment, since a surface area of the side of the terminal 30 increases due to the grooves 30g, it is possible to provide the more solder 31 on the terminal 30, as compared to a configuration where the grooves 30g are not provided.

Subsequently, a manufacturing method of the terminal 30 is described.

Figure 17A:
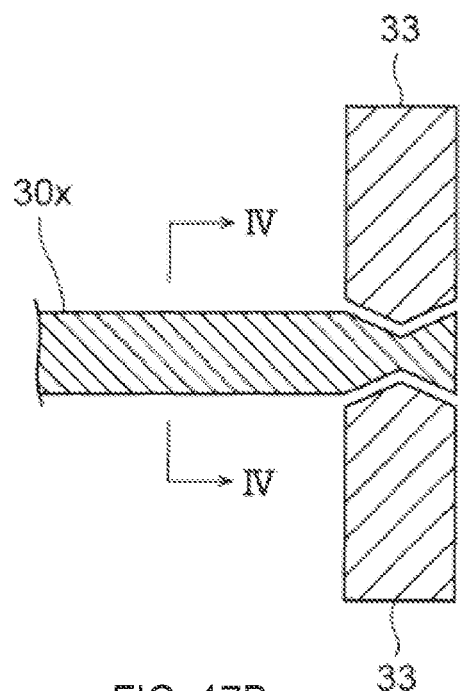
FIG. 17A is a sectional view depicting a manufacturing method of the terminal relating to the second exemplary embodiment.

FIG. 17A is a sectional view depicting a manufacturing method of the terminal 30 relating to the second exemplary embodiment. Also, FIG. 17B is a partial sectional side view taken along a line IV-IV of FIG. 17A.

Figure 17B:
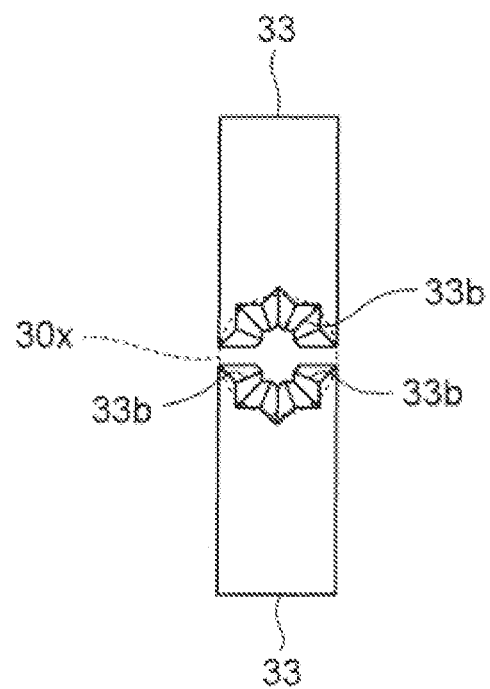
FIG. 17B is a partial sectional side view taken along a line IV-IV of FIG. 17A.

As shown in FIGS. 17A and 17B, also in the second exemplary embodiment, the wire rod 30x is rotated and pinched several times by the pair of jigs 33 and is thus formed with the narrowed part 30c (refer to FIG. 15B).

In the meantime, the wire rod 30x may be processed into a tapered shape by a rolling processing method or the like.

Also, as shown in FIG. 17B, the jig 33 is provided with a concavity and convexity 33b corresponding to the groove 30g (refer to FIG. 15A), so that it is possible to form the groove 30g by transferring the concavity and convexity 33b to the wire rod 30x.

Figure 18:
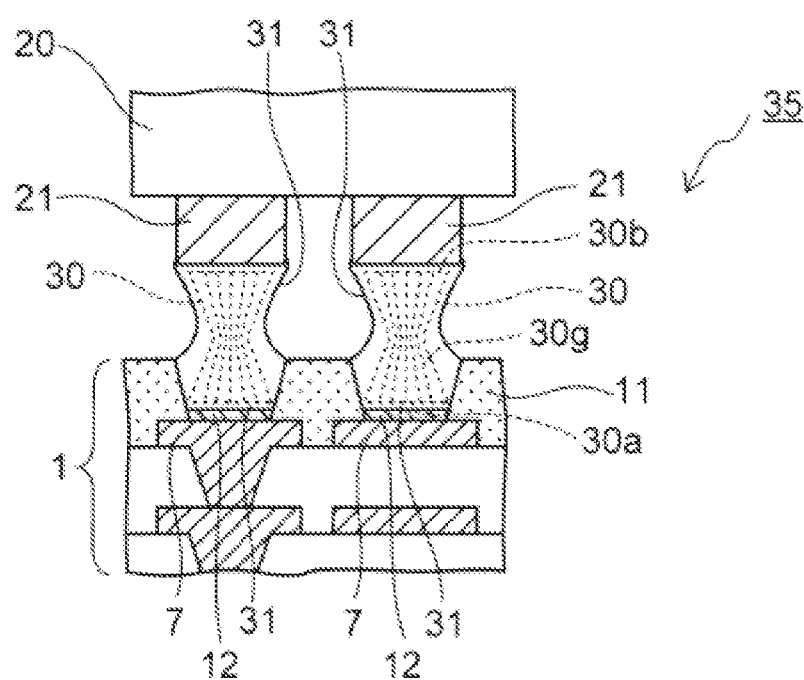
FIG. 18 is a partial sectional side view of a wiring substrate device in accordance with the second exemplary embodiment.

FIG. 18 is a partial sectional side view of a wiring substrate device 35 having the terminals 30 in accordance with the second exemplary embodiment.

Meanwhile, in FIG. 18, the same elements as those described in the first exemplary embodiment are denoted with the same reference numerals as those in the first exemplary embodiment and the descriptions thereof are omitted.

The wiring substrate device 35 is manufactured by performing the same processes as FIGS. 10A to 11B of the first exemplary embodiment, and has a structure where the wiring substrate 1 and the semiconductor device 20 are connected to each other by the terminals 30.

In the second exemplary embodiment, the grooves 30g are formed, so that it is possible to provide the more solder 31 on the surface of the terminal 30. Therefore, the solder 31 is difficult to be insufficient at the lower end 30a and the upper end 30b of the terminal 30. As a result, it is possible to sufficiently secure the connection strength between the terminal 30 and the wiring substrate 1 and the connection strength between the terminal 30 and the semiconductor device 20 by the solders 31.

Third Exemplary Embodiment

In a third exemplary embodiment, a shape of the narrowed part 30c is different from the first exemplary embodiment.

Figure 19A:
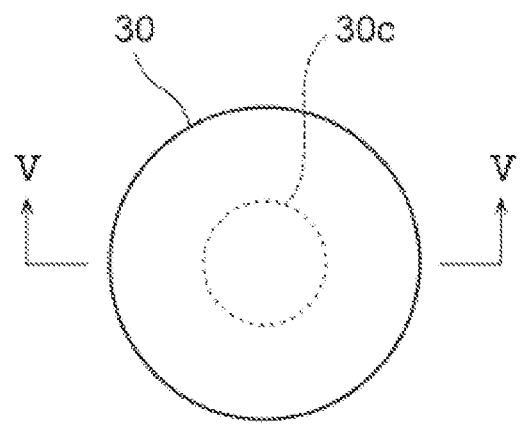
FIG. 19A is a top view of a terminal relating to a third exemplary embodiment.
Figure 19B:
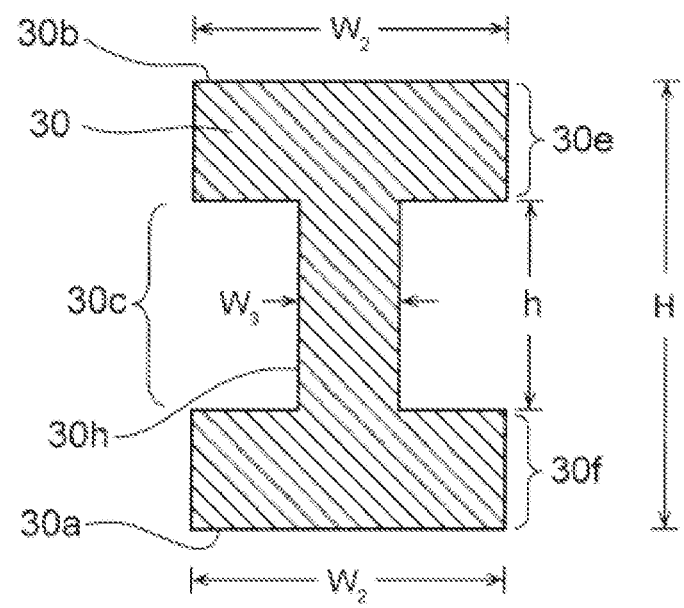
FIG. 19B is a sectional view taken along a line V-V of FIG. 19A.

FIG. 19A is a top view of the terminal 30 relating to the third exemplary embodiment, and FIG. 19B is a sectional view taken along a line V-V of FIG. 19A.

Meanwhile, in FIGS. 19A and 19B, the same elements as those described in the first exemplary embodiment are denoted with the same reference numerals as those in the first exemplary embodiment and the descriptions thereof are omitted.

As shown in FIGS. 19A and 19B, the terminal 30 of the third exemplary embodiment has an upper plate 30e including the upper end 30b, a lower plate 30f including the lower end 30a, and a column-shaped part 30h connecting the upper plate 30e and the lower plate 30f each other.

The column-shaped part 30h is a part becoming the above-described narrowed part 30c, and has a width $W_3$ that is constant between the lower end 30a and the upper end 30b.

The width W3 is, for example, about 5 μm to 495 μm, and a height h of the column-shaped part 30h is, for example, about 5 μm to 800 μm. Also, the width $W_2$ of each of the lower end 30a and the upper end 30b is about 10 μm to 500 μm, like the first exemplary embodiment. A height H of the terminal 30 is about 10 μm to 1000 μm.

Figure 20:
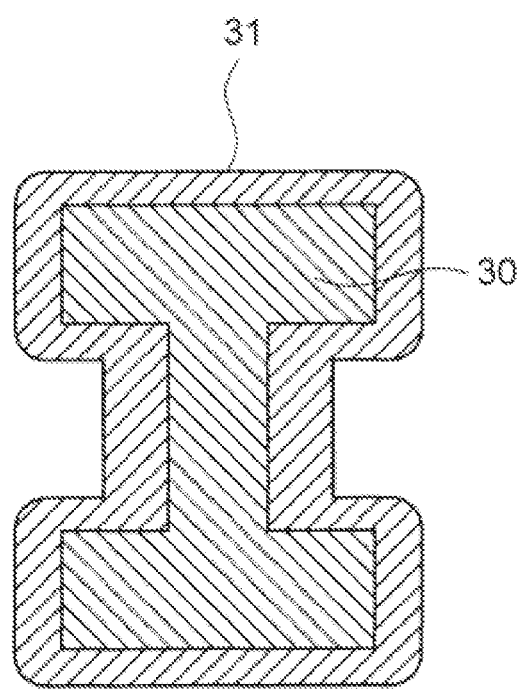
FIG. 20 is a sectional view depicting a case where the terminal of the third exemplary embodiment is provided with a solder.

FIG. 20 is a sectional view depicting a case where the terminal 30 is provided with the solder 31.

Like the first exemplary embodiment and the second exemplary embodiment, the solder 31 is formed on the surface of the terminal 30 by the barrel plating.

Subsequently, a manufacturing method of the terminal 30 is described.

Figure 21A:
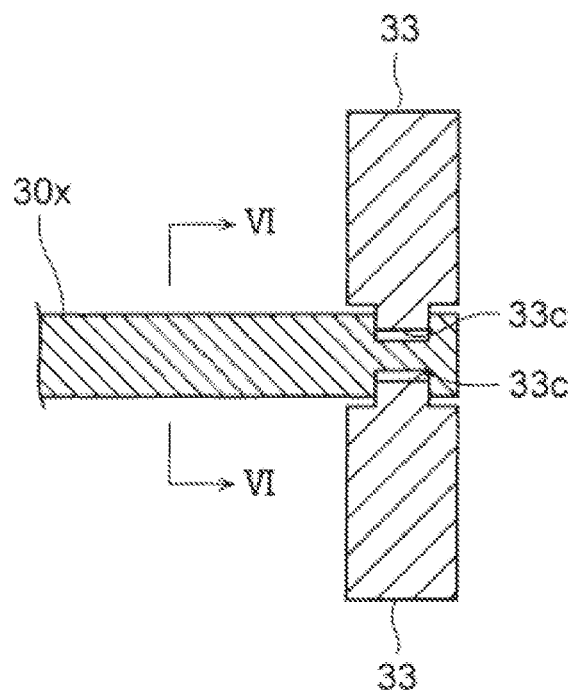
FIG. 21A is a sectional view depicting a manufacturing method of the terminal relating to the third exemplary embodiment.

FIG. 21A is a sectional view depicting a manufacturing method of the terminal 30 relating to the third exemplary embodiment. Also, FIG. 21B is a partial sectional side view taken along a line VI-VI of FIG. 21A.

Figure 21B:
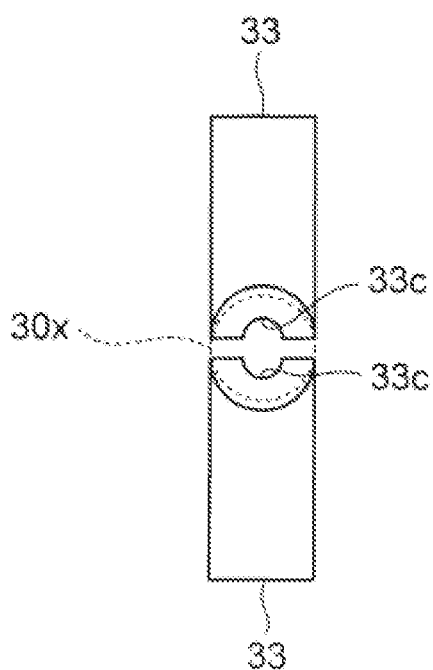
FIG. 21B is a partial sectional side view taken along a line VI-VI of FIG. 21A.

As shown in FIGS. 21A and 21B, also in the third exemplary embodiment, the wire rod 30x is rotated and pinched several times by the pair of jigs 33 and is thus formed with the narrowed part 30c (refer to FIG. 19B).

In the meantime, the wire rod 30x may be formed with the narrowed part 30c by a rolling processing method or the like.

As shown in FIG. 21B, each jig 33 is provided with a convex part 33c having a semicircular shape corresponding to the column-shaped narrowed part 30c. It is possible to form the column-shaped narrowed part 30c by transferring the shape of the convex part 33c to the wire rod 30x.

Figure 22:
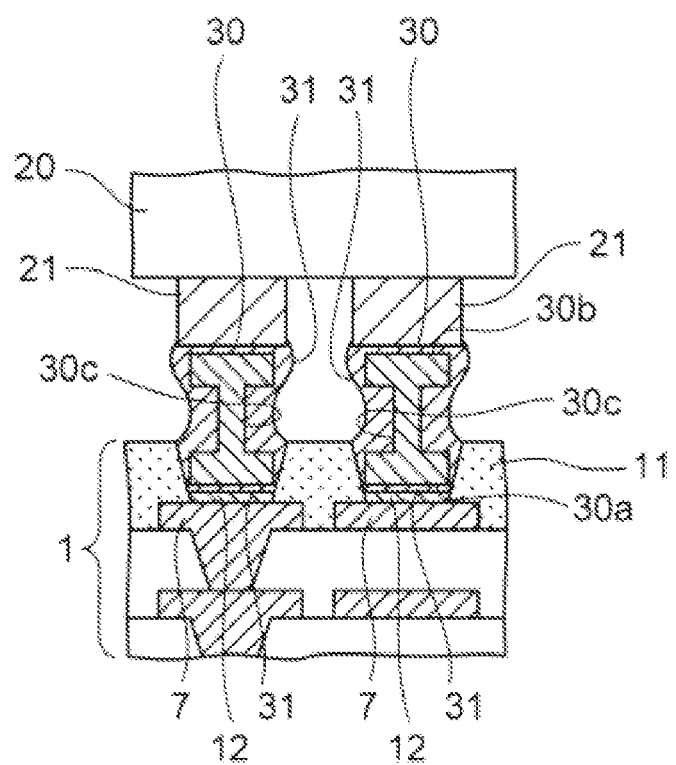
FIG. 22 is an enlarged sectional view of a wiring substrate device of the third exemplary embodiment.

FIG. 22 is an enlarged sectional view of a wiring substrate device having the terminals 30 in accordance with the third exemplary embodiment.

Meanwhile, in FIG. 22, the same elements as those described in the first exemplary embodiment are denoted with the same reference numerals as those in the first exemplary embodiment and the descriptions thereof are omitted.

The wiring substrate device is manufactured by performing the same processes as FIGS. 10A to 11B of the first exemplary embodiment, and has a structure where the wiring substrate 1 and the semiconductor device 20 are connected to each other by the terminals 30.

In the third exemplary embodiment, the narrowed part 30c is formed to have a column shape, as described above. Therefore, it is possible to largely retreat the surface of the narrowed part 30c from a surface of each of the lower end 30a and the upper end 30b, and to largely separate the narrowed parts 30c of the adjacent terminals 30. For this reason, even when the solder 31 is reflowed in the process of FIG. 11B, it is possible to effectively suppress the adjacent terminals 30 from being connected each other due to the solder 31.

Also, even when the narrowed part 30c is formed to have a column shape, following effects are accomplished, like the first exemplary embodiment.

Figure 23:
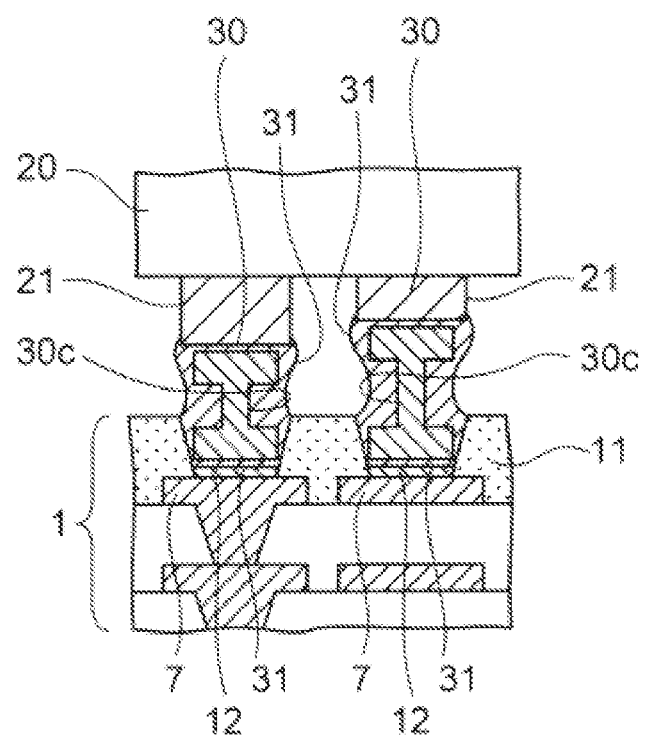
FIG. 23 is a sectional view for illustrating an effect to be accomplished in the third exemplary embodiment (1 thereof).
Figure 24:
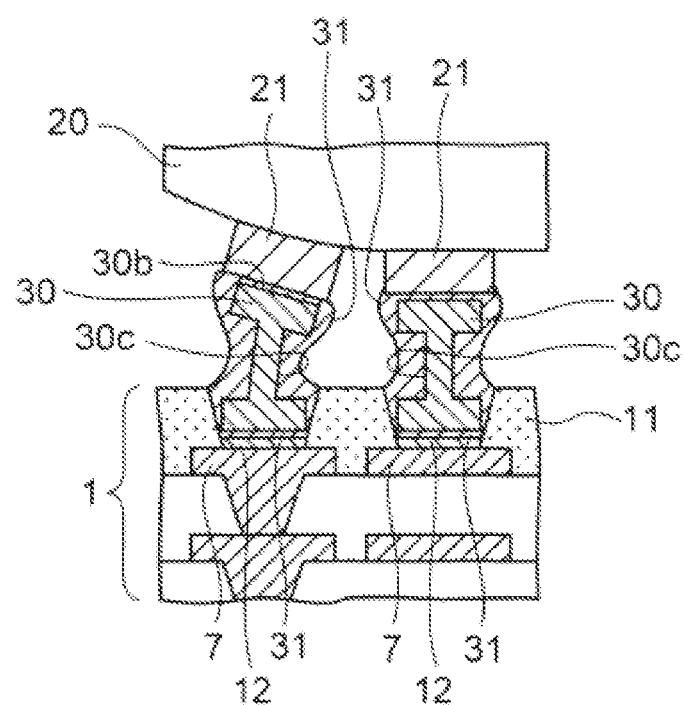
FIG. 24 is a sectional view for illustrating an effect to be accomplished in the third exemplary embodiment (2 thereof).

FIGS. 23 and 24 are sectional views for illustrating effects to be accomplished in the third exemplary embodiment.

FIG. 23 is a sectional view depicting a case where the heights of the plurality of electrodes 21 are not uniform due to a manufacturing error.

In this case, the narrowed parts 30c are squashed, so that it is possible to absorb the non-uniformity of the heights of the respective electrodes 21 by the terminals 30 and to connect each of the plurality of terminals 30 to the electrode 21.

FIG. 24 is a sectional view depicting a case where the semiconductor device 20 is bent due to thermal expansion or the like.

In this case, the narrowed part 30c is bent, so that the upper end 30b of the terminal 30 conforms to the bending of the semiconductor device 20 and it is thus possible to connect each of the plurality of terminals 30 to the electrode 21.

Fourth Exemplary Embodiment

In the first to third exemplary embodiments, the semiconductor device 20 is used as a component that is connected to the wiring substrate 1 via the terminals 30. However, in a fourth exemplary embodiment, a wiring substrate is used as the component.

Figure 25:
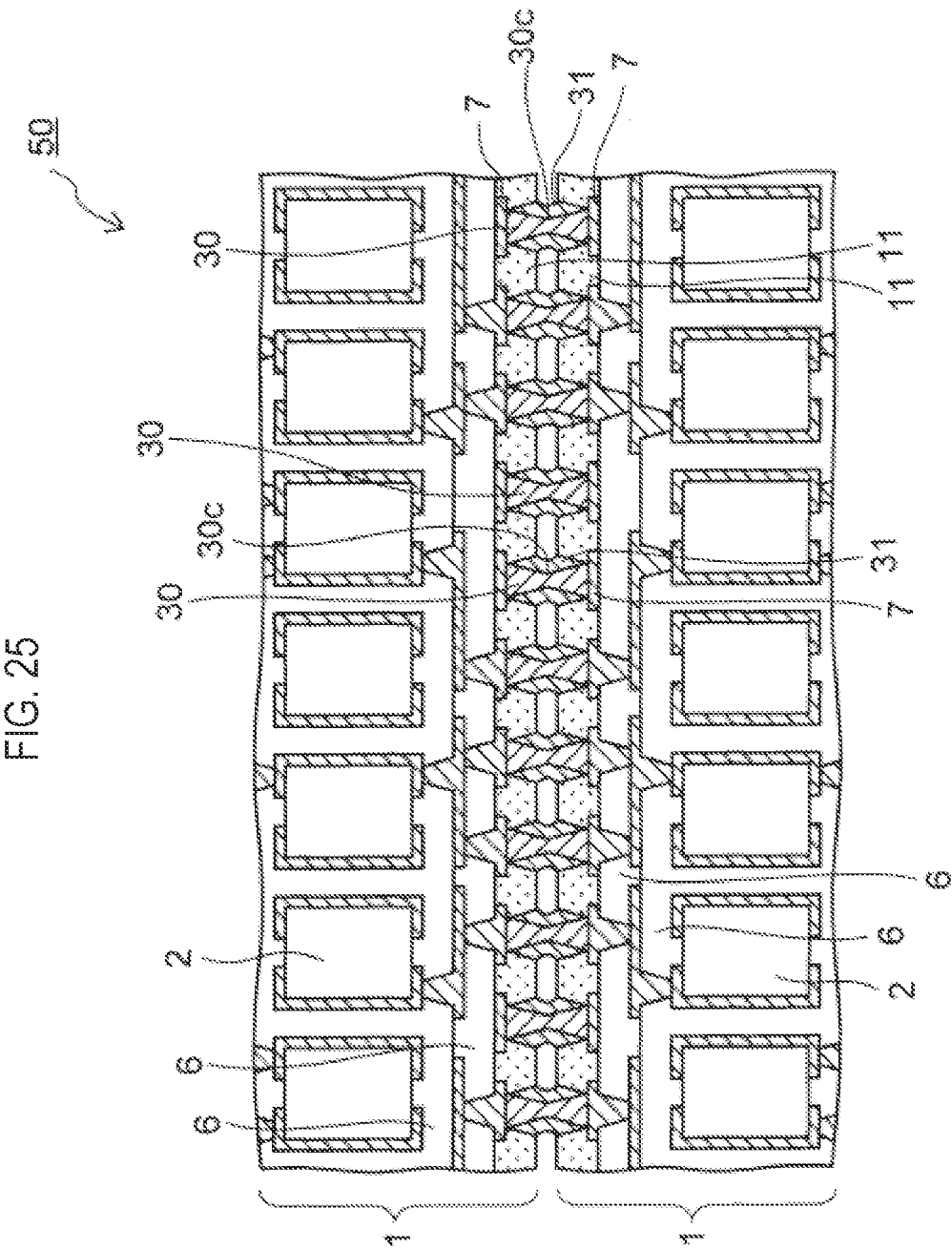
FIG. 25 is an enlarged sectional view of a wiring substrate device in accordance with a fourth exemplary embodiment.

FIG. 25 is an enlarged sectional view of a wiring substrate device in accordance with the fourth exemplary embodiment.

Meanwhile, in FIG. 25, the same elements as those described in the first exemplary embodiment are denoted with the same reference numerals as those in the first exemplary embodiment and the descriptions thereof are omitted.

As shown in FIG. 25, in a wiring substrate device 50, the two wiring substrates 1 are made to face each other. Then, the solders 31 are reflowed and melted, so that the wirings 7 of the wiring substrates 1 are connected to each other via the terminals 30.

Since the terminal 30 is provided with the narrowed part 30c, as described above, the melted solder 31 is accumulated at the narrowed part 30c, so that it is possible to prevent the solder 31 from spreading in the horizontal direction of the substrate. As a result, it is possible to suppress the adjacent terminals 30 from being connected to each other due to the solder 31, so that it is possible to improve the yield of the wiring substrate device 50.

What is claimed is:

1. A wiring substrate device comprising:
a wiring substrate;
a plurality of terminals each of which is provided upright on the wiring substrate and has a lower end provided on the wiring substrate, an upper end opposite to the lower end, a side surface extending between the lower end and the upper end, and a narrowed part in the side surface between the lower end and the upper end, the narrowed part having a narrow portion having a smallest width of the terminal, as seen from a cross sectional view, in a width direction of the terminal, the width direction being orthogonal to a height direction of the terminal, the height direction of the terminal extending between the lower end and the upper end; and
a plurality of solders each of which has a melting point lower than the terminals and covers a surface of the corresponding terminal,
wherein the side surface of each of the terminals defines a plurality of grooves therein, the plurality of grooves extending, in the height direction of the terminal, between the lower end and the upper end, the plurality of grooves each reaching both the lower end and the upper end, and the plurality of grooves passing through the narrowed part.

2. The wiring substrate device according to claim 1,
wherein a sectional shape of the terminal is thinned in a tapered shape from the lower end toward the narrow portion and the sectional shape of the terminal is widened in a tapered shape from the narrow portion toward the upper end.

3. The wiring substrate device according to claim 2,
wherein the wiring substrate comprises:
a wiring connected to the terminals via the solders, and
a solder resist layer formed on the wiring around the terminals, and
wherein the narrow portion is positioned above an upper surface of the solder resist layer.

4. The wiring substrate device according to claim 1, further comprising:
a component connected to the terminals via the solders.

5. The wiring substrate device according to claim 4,
wherein the component is a semiconductor device or a separate wiring substrate from the wiring substrate.

* * * * *